(12) United States Patent
Shah et al.

(10) Patent No.: US 6,547,124 B2
(45) Date of Patent: Apr. 15, 2003

(54) METHOD FOR FORMING A MICRO COLUMN GRID ARRAY (CGA)

(75) Inventors: Tushar T. Shah, Columbia, MD (US); Andrew TS Pomerene, Leesburg, VA (US); Keith K. Sturcken, Nokesville, VA (US); Steven J. Wright, Fredericksburg, VA (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 09/881,251

(22) Filed: Jun. 14, 2001

(65) Prior Publication Data

US 2002/0190107 A1 Dec. 19, 2002

(51) Int. Cl.⁷ .......................... B23K 35/12; B23K 31/02
(52) U.S. Cl. ................... 228/246; 228/214; 228/180.4; 228/256
(58) Field of Search ....................... 228/180.21, 180.22, 228/214, 215, 246, 248.1, 248.5, 256–262; 427/96

(56) References Cited

U.S. PATENT DOCUMENTS

| | | | |
|---|---|---|---|
| 5,024,372 A | * | 6/1991 | Altman et al. ......... 228/180.22 |
| 5,251,806 A | * | 10/1993 | Agarwala et al. ...... 228/180.22 |
| 5,542,174 A | | 8/1996 | Chiu |
| 5,639,696 A | | 6/1997 | Liang et al. |
| 5,718,361 A | * | 2/1998 | Braun et al. ................ 228/56.3 |
| 5,861,663 A | | 1/1999 | Issacs et al. |
| 5,914,535 A | | 6/1999 | Brandenburg |
| 5,956,606 A | | 9/1999 | Burnette |
| 5,961,032 A | * | 10/1999 | Covell, II et al. .......... 228/254 |
| 5,964,396 A | | 10/1999 | Brofman et al. |
| 5,968,670 A | | 10/1999 | Brofman et al. |
| 5,977,640 A | | 11/1999 | Bertin et al. |
| 6,025,649 A | | 2/2000 | DiGiacomo |
| 6,051,887 A | | 4/2000 | Hubbard |
| 6,053,394 A | | 4/2000 | Dockerty |
| 6,059,173 A | | 5/2000 | Mays et al. |
| 6,114,187 A | | 9/2000 | Hayes |
| 6,173,887 B1 | * | 1/2001 | Mead et al. ............ 219/121.63 |

* cited by examiner

Primary Examiner—M. Alexandra Elve
Assistant Examiner—Len Tran
(74) Attorney, Agent, or Firm—Dicke, Billig & Czaja, PLLC

(57) ABSTRACT

A method of forming a plurality of micro column interconnection structures on a semiconductor includes providing a semiconductor layer. A photoresist layer is formed on the semiconductor layer. A plurality of cavities are etched in the photoresist layer. The plurality of cavities extend through the photoresist layer to the semiconductor layer. Solder is deposited in the plurality of cavities, thereby forming a plurality of micro columns of solder.

27 Claims, 6 Drawing Sheets

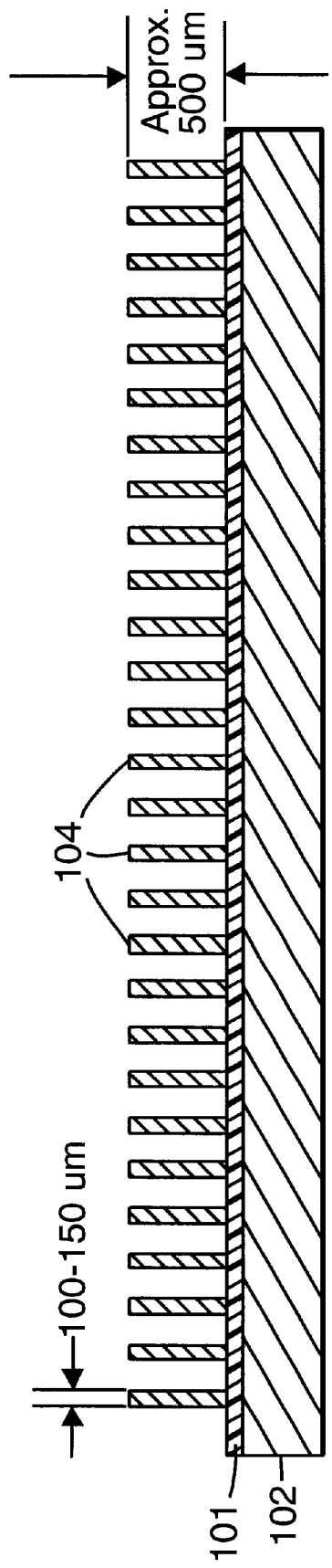
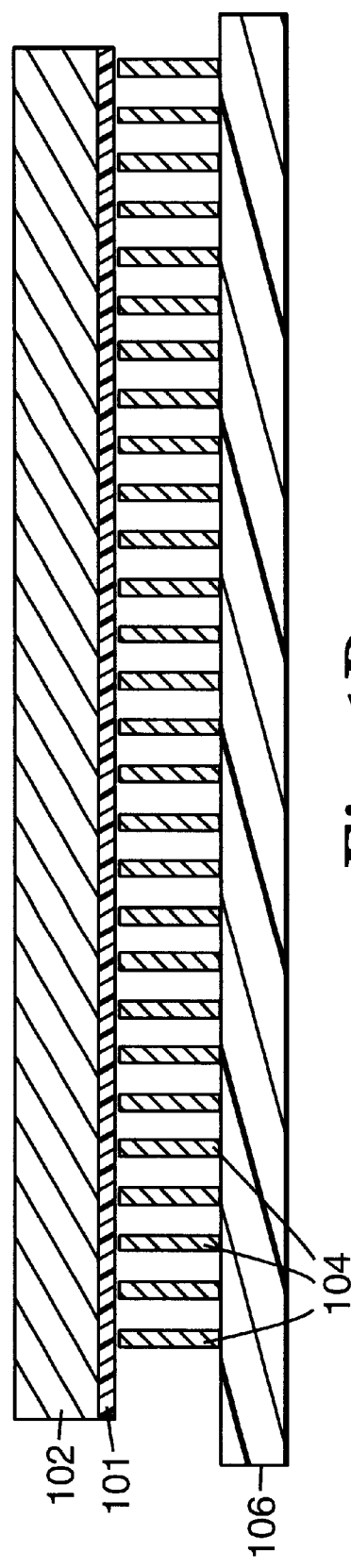

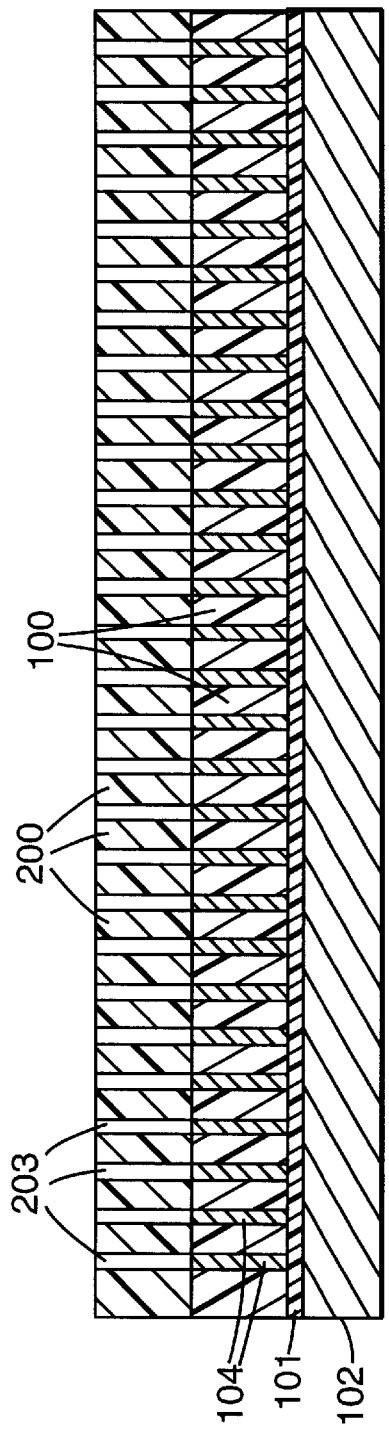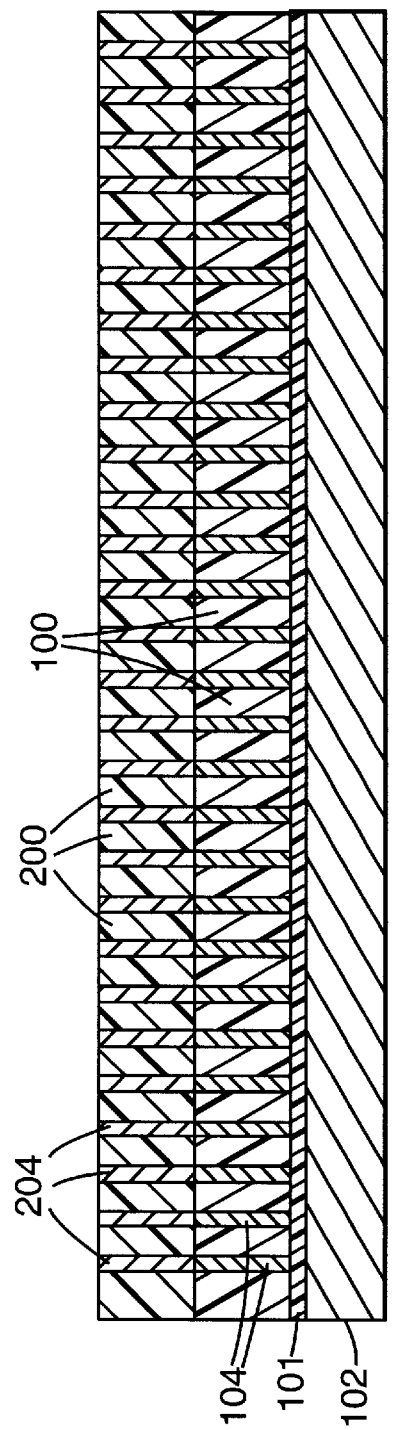
Fig. 2A
Fig. 2B

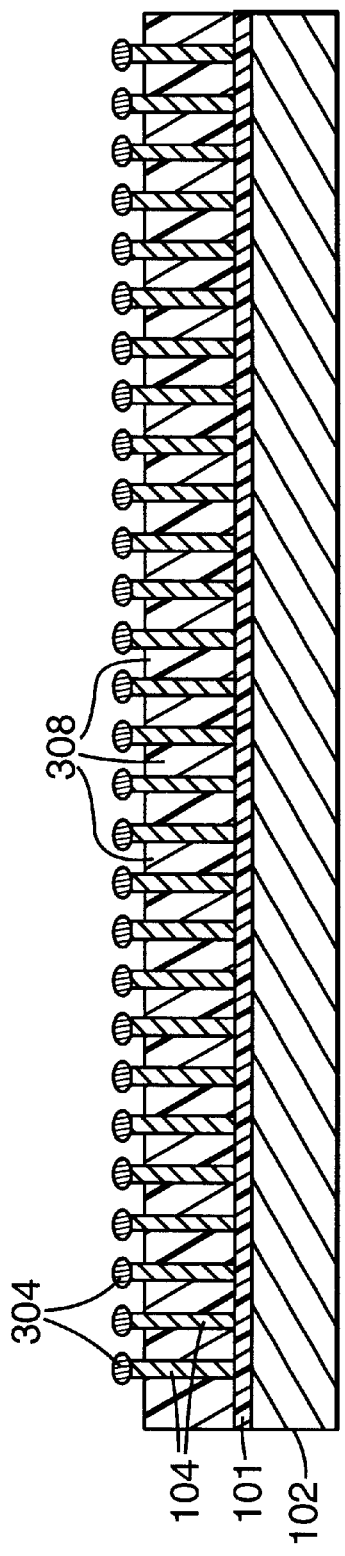
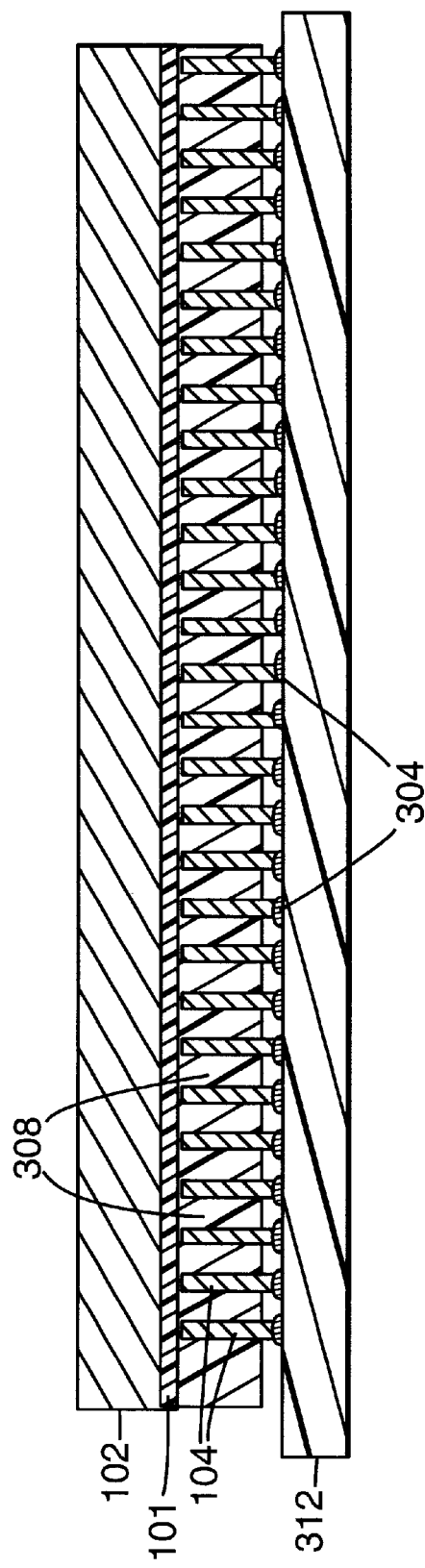

METHOD FOR FORMING A MICRO COLUMN GRID ARRAY (CGA)

THE FIELD OF THE INVENTION

This invention relates generally to methods for forming interconnection structures for electronic chips. This invention relates more particularly to a method for forming a micro column grid array (CGA).

BACKGROUND OF THE INVENTION

Two levels of interconnection structures are typically used to join a semiconductor die to a printed circuit board. A first level of interconnection is typically provided between a semiconductor die and a substrate, and then a second level of interconnection is provided between the substrate and the printed circuit board.

One common technique of packaging a semiconductor die is to flip-chip join a semiconductor die to a ceramic substrate. The flip chip approach offers significant advantages in terms of input/output (I/O), packaging density, electrical performance, and manufacturability of a module. A traditional method for achieving a flip chip interconnect is to deposit solder bumps onto an active surface of a semiconductor die. The solder bumps ultimately get reflowed into a spherical shape when making the connection between the semiconductor die and contact pads on a substrate. Electrical traces extend through the substrate to an opposing surface thereof, and connect to an array of solder pads, which are typically spaced apart from each other on a much larger scale than the bumps on the semiconductor die. While this approach has been proven effective, it does have limitations in the achievable I/O contact density, and more significantly, in the reliability of the connections. The reliability issue is due to the fact that a silicon chip and the next level of packaging (e.g., ceramic or organic packaging) experience very different rates of thermal expansion and contraction, and solder has particularly poor fatigue properties.

The problem of differing rates of thermal expansion has been addressed at the board level by attaching components to organic circuit boards with metal columns, which is a form of surface mount technology. Surface mount technology has gained acceptance as a preferred method for joining electronic components to printed circuit boards. Conventional surface mount technology approaches include ball grid arrays (BGAs) and column grid arrays (CGAs). A BGA is an array of spherical solder balls that are attached to a chip, and are used to mount the chip to a printed circuit board. A CGA is an array of cylindrical solder columns that are attached to a chip, and are used to mount the chip to a printed circuit board. The columns offer the same density and performance as a spherical attachment element, but the taller configuration of the solder columns offers compliancy to better absorb the differential thermal expansion rate between the component and the board. The compliancy virtually eliminates the reliability concern caused by the thermal expansion mismatch.

At the wafer level, a technique has been proposed for forming solder columns using solder jetting technology. Such a technique is disclosed in U.S. Pat. No. 6,114,187, issued Sep. 5, 2000, and entitled "METHOD FOR PREPARING A CHIP SCALE PACKAGE AND PRODUCT PRODUCED BY THE METHOD". In the '187 patent, printing technologies are used to print a package directly onto the semiconductor wafer. The '187 patent notes that the prior art does not print the package directly onto a semiconductor wafer, and that it would be advantageous to build the package directly onto the semiconductor wafer and then divide the wafer into individual semiconductors. The technique disclosed in the '187 patent involves forming solder columns with a solder jetting device that drops successive droplets of solder on top of each other, until the desired column height is reached.

There are several limitations in using solder jetting techniques, such as those disclosed in the '187 patent. First, there are processing speed limitations, in that only one solder column can be formed at a time, unless multiple solder jetting devices are used, which adds to the complexity of the system. Second, it appears that only one wafer can be processed at a time. Third, the repeatability of the process for large-scale fabrication is questionable. The techniques appear to be more appropriate for small, custom applications.

It would be desirable to provide a unique method of forming solder columns using wafer-level processing, without the complexity or limitations of solder jetting technology.

SUMMARY OF THE INVENTION

One form of the present invention provides a method of forming a plurality of micro column interconnection structures on a semiconductor. A semiconductor layer is provided. A photoresist layer is formed on the semiconductor layer. A plurality of cavities are etched in the photoresist layer. The plurality of cavities extend through the photoresist layer to the semiconductor layer. Solder is deposited in the plurality of cavities, thereby forming a plurality of micro columns of solder.

Another form of the present invention provides a method of preparing a chip scale package. A microelectronic device having a connection surface is provided. A photoresist layer is formed on the connection surface of the microelectronic device. A plurality of cavities are formed in the photoresist layer. The plurality of cavities extend through the photoresist layer to the connection surface. Solder is deposited in the plurality of cavities, thereby forming a plurality of solder columns on the connection surface.

BRIEF DESCRIPTION OF THE DRAWINGS

FIGS. 1A–1D are cross-sectional diagrams illustrating one embodiment of a process for forming a micro column grid array according to the present invention.

FIGS. 2A–2C are cross-sectional diagrams illustrating one embodiment of a process for extending the height of the columns in a micro column grid array according to the present invention.

FIGS. 3A–3E are cross-sectional diagrams illustrating an alternative embodiment of a process for forming a micro column grid array according to the present invention, including the formation of a protective layer that surrounds the micro columns.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
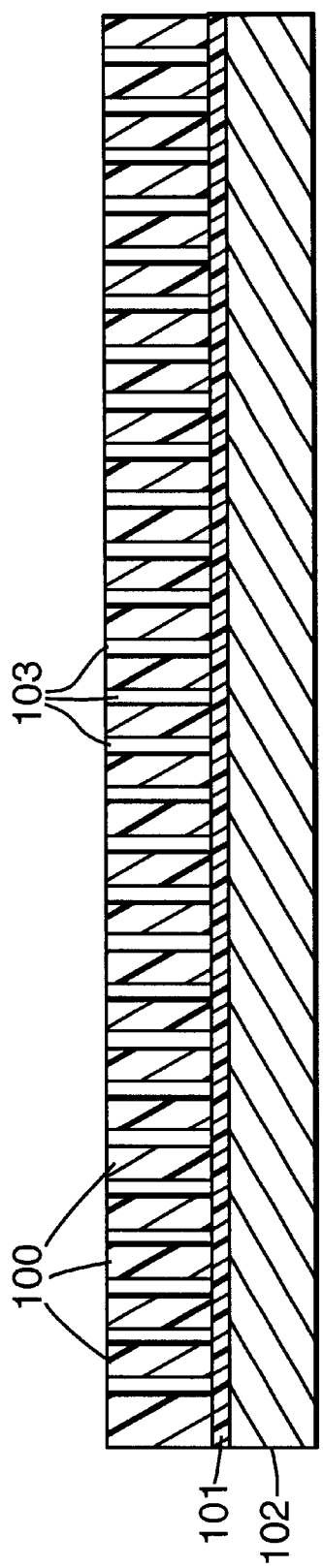

FIGS. 1A–1D are cross-sectional diagrams illustrating one embodiment of a process for forming a micro column grid array according to the present invention. As shown in FIG. 1A, a layer of photoresist 100 is formed on a connection surface or active layer 101 of a semiconductor layer 102. Photoresist layer 100 is then etched to provide openings or cavities 103 where solder columns will be formed. In one form of the invention, cavities 103 are generally cylindrically shaped. In one embodiment, semiconductor layer 102 is a semiconductor wafer. In another form of the invention, semiconductor layer 102 is a semiconductor chip. The etched openings 103 are formed over input/output (I/O) contact pads (not shown) on connection surface 101.

Figure 1B:
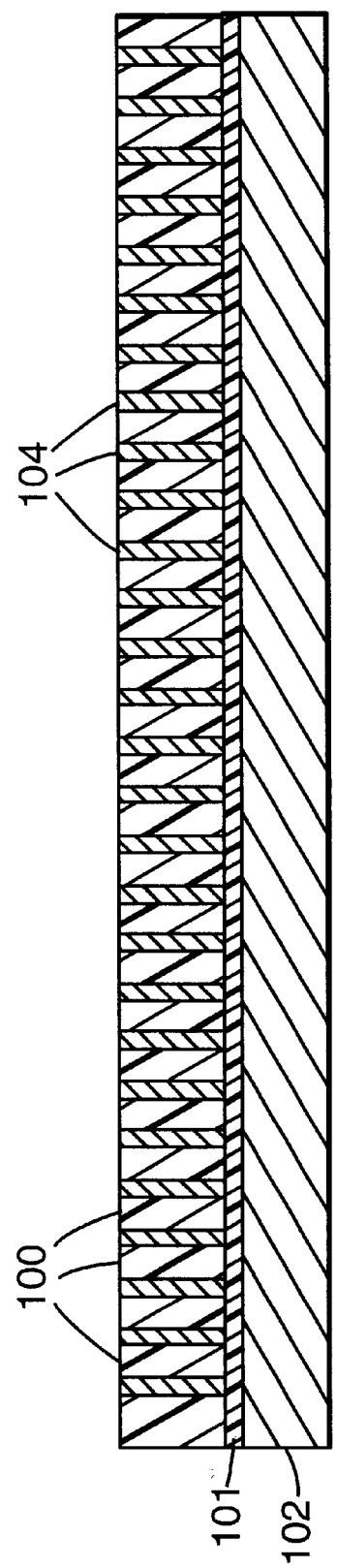

In FIG. 1B, solder is vapor deposited on the photoresist-covered surface of semiconductor layer 102. The vapor-deposited solder fills the etched cavities 103 in photoresist layer 100, thereby forming solder columns 104 on the contact pads of connection surface 101. In one embodiment, rather than using vapor deposition, solder is formed in etched cavities 103 by sputtering or electroplating. In one form of the invention, the solder is a low tin solder with a composition of about 90 percent lead and about 10 percent tin. After deposition of the solder, excess solder on the top surface of photoresist layer 100 is removed by a grinding process.

Next, as shown in FIG. 1C, photoresist layer 100 is removed, leaving a micro column grid array (CGA) of solder columns 104. In one form of the invention, photoresist layer 100 is removed by etching. In one embodiment, solder columns 104 are generally cylindrical in shape, with a diameter of about 100–150 micrometers, a height of about 100–500 micrometers, and pitch of about 1000 micrometers, although virtually any pitch may be provided. After columns 104 have been formed, and photoresist layer 100 has been removed, the device is ready to mount to the next level of packaging as a true chip scale package (CSP). As shown in FIG. 1D, semiconductor layer 102 is directly connected to the next level of packaging 106 (e.g., circuit board or other substrate layer) with micro columns 104.

It is desirable to have a solder column height of about 400–500 micrometers to provide an appropriate level of reliability. Typically, the taller the solder column, the greater the level of compliancy. In one embodiment, the process described above is capable of providing a column height of approximately 100 micrometers. To provide additional column height, the process described above is repeated as many times as necessary on top of the existing structure, until the desired column height is reached.

Figure 2C:
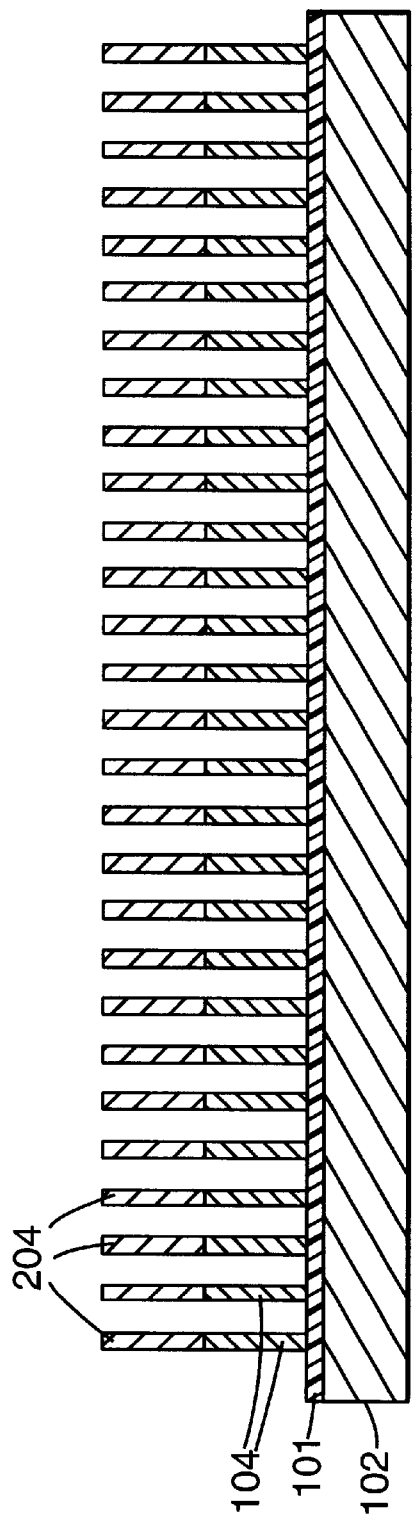

FIGS. 2A–2C are cross-sectional diagrams illustrating one embodiment of a process for extending the height of the columns in a micro column grid array according to the present invention. FIG. 2A illustrates a device or wafer in the process stage shown in FIG. 1B, with a second layer of photoresist 200 formed over the first layer of photoresist 100. Photoresist layer 200 is etched to provide openings or cavities 203 positioned over the existing solder columns 104.

In FIG. 2B, solder is vapor deposited on the device, thereby filling the etched cavities 203 in photoresist layer 200 and forming solder column extensions 204 on top of solder columns 104. In one embodiment, rather than using vapor deposition, solder is formed in etched cavities 203 by sputtering or electroplating. After deposition of the solder, excess solder on the top surface of photoresist layer 200 is removed by a grinding process.

Next, as shown in FIG. 2C, photoresist layers 100 and 200 are removed, leaving a micro column grid array of solder columns 104 extended by solder column extensions 204. In one form of the invention, photoresist layers 100 and 200 are removed by etching. In one embodiment, after the preferred column height is reached and the wafer-level processing is complete, semiconductor layer 102 is diced into individual semiconductor chips in a conventional manner.

Figure 3A:
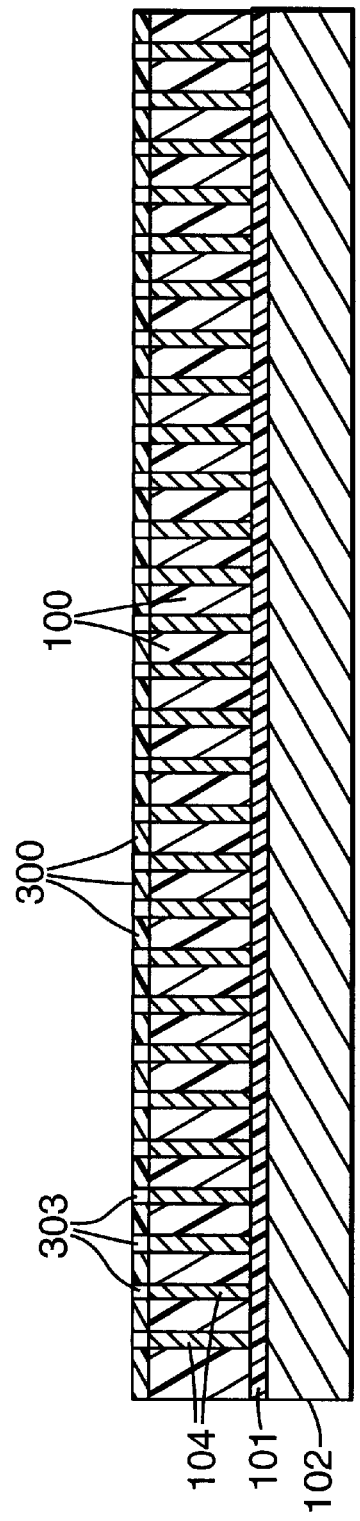

FIGS. 3A–3E are cross-sectional diagrams illustrating an alternative embodiment of a process for forming a micro column grid array according to the present invention, including the formation of a protective layer that surrounds the micro columns. FIG. 3A illustrates a device or wafer in the process stage shown in FIG. 1B, with a second layer of photoresist 300 formed over the first layer of photoresist 100. Photoresist layer 300 is etched to provide openings or cavities 303 positioned over the existing columns 104.

Figure 3B:
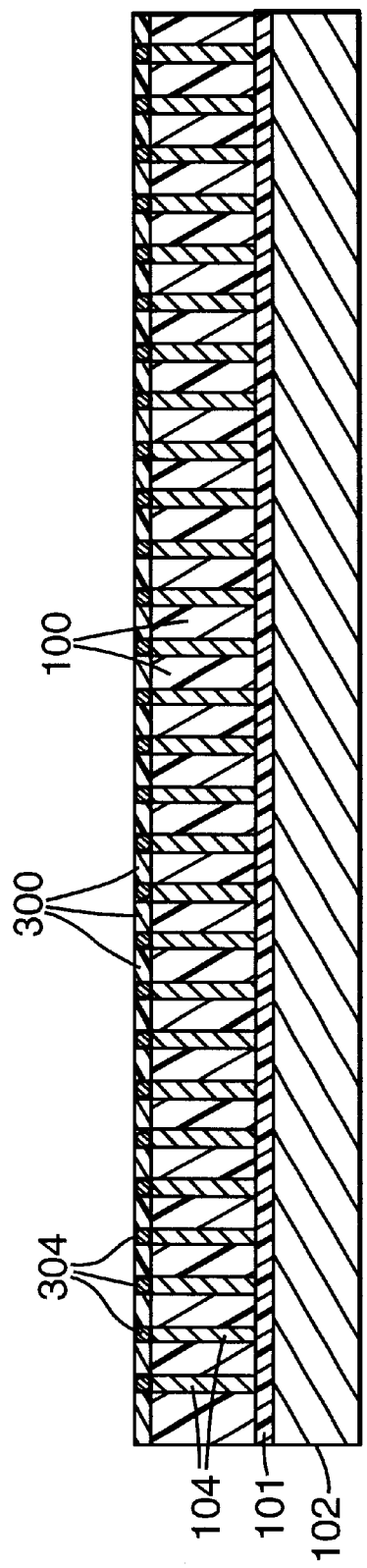
Figure 3C:
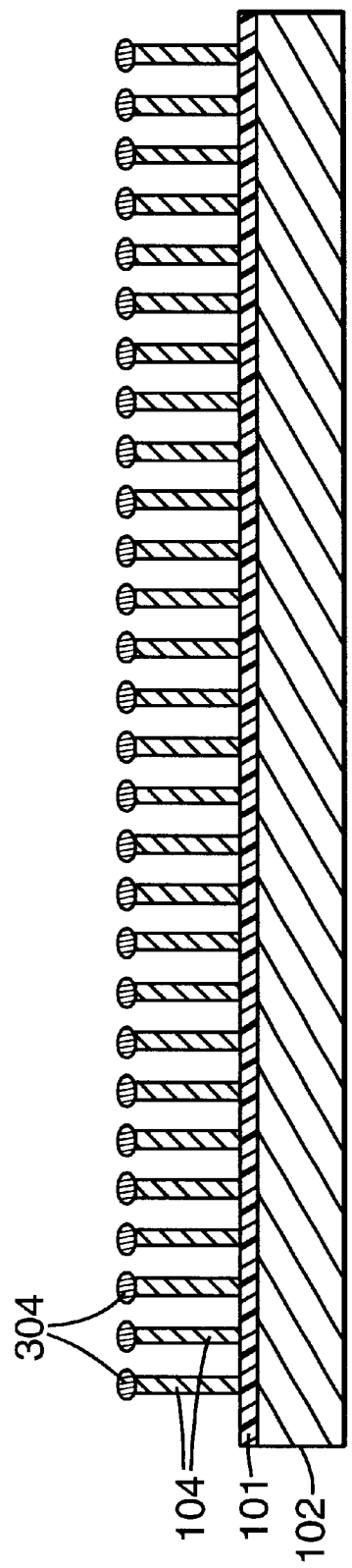

In FIG. 3B, eutectic solder bumps 304 are vapor deposited in etched cavities 303 on top of solder columns 104. In one embodiment, solder bumps 304 are about 63% lead and about 10% tin. Next, as shown in FIG. 3C, photoresist layers 100 and 300 are removed and solder bumps 304 are reflowed, leaving a micro column grid array of solder columns 104 with solder bumps 304 formed thereon. In one form of the invention, photoresist layers 100 and 300 are removed by etching.

Next, as illustrated in FIG. 3D, a protective layer 308 is applied to connection surface 101 of semiconductor layer 102, and around micro columns 104. In one embodiment, protective layer 308 is an elastic polymer. In another embodiment, protective layer 308 is a silicon-based material.

In FIG. 3E, solder bumps 304 are reflowed to attach semiconductor layer 102 to circuit board 312. In one embodiment, solder bumps 304 have a different composition and a lower melting temperature than solder columns 104. Protective layer 308 provides protection to semiconductor layer 102 and support to micro columns 104, and makes the component more robust. Protective layer 308 preferably does not extend up to the entire height of columns 104, as this would reduce the flexibility of columns 104, and limit the compliancy columns 104 provide between semiconductor layer 102 and circuit board 312. In one embodiment, protective layer 308 is applied while devices are still in wafer form to allow application to multiple devices at one time.

Embodiments of the present invention provide increased reliability and versatility, and allow chips to be placed into packaging configurations that were previously not considered feasible. Examples of configurations that may be provided include flip chip plastic packaging, direct mount of large, high I/O silicon chips onto an organic circuit board (Chip on Board), and attachment of chips to metal frames without the use of wirebonding. Additional applications include chip stacking, and conversion of existing wirebond die into flip chip mountable die. Through chip level processing according to embodiments of the present invention, micro column connections between a chip and the next level of packaging can be provided at a greater density than the connections in current flip chip designs. The micro columns also provide a level of reliability that allows greater versatility in chip packaging. By using chip/wafer level processes, metal columns can be deposited onto chip contacts with an ultra fine diameter and pitch. Multiple wafers may be processed at one time, thereby providing increased processing speed.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of forming a plurality of micro column interconnection structures on a semiconductor, the method comprising:

providing a semiconductor layer;

forming a photoresist layer on the semiconductor layer;

etching a plurality of cavities in the photoresist layer, the plurality of cavities extending through the photoresist layer to the semiconductor layer;

depositing solder in the plurality of cavities, thereby forming a plurality of micro columns of solder, each micro column of solder having a column thickness of between about 100 and 150 micrometers; and wherein the micro columns of solder have a height between about 100 and 500 micrometers; and removing the photoresist layer.

2. The method of claim 1, wherein the solder is deposited in the plurality of cavities by vapor deposition.

3. The method of claim 1, wherein the solder is deposited in the plurality of cavities by sputtering.

4. The method of claim 1, wherein the solder is deposited in the plurality of cavities by electroplating.

5. The method of claim 1, wherein the solder comprises about 90 percent lead and about 10 percent tin.

6. The method of claim 1, wherein the micro columns of solder are substantially cylindrical.

7. The method of claim 1, wherein the micro columns of solder have a pitch of less than about 1000 micrometers.

8. The method of claim 1, and further comprising:

forming a second plurality of micro columns of solder on the plurality of micro columns of solder.

9. The method of claim 1, and further comprising:

forming a plurality of micro column solder extensions on each of the plurality of micro columns of solder.

10. The method of claim 1, and further comprising:

forming a protective layer on the semiconductor layer that substantially surrounds the micro columns of solder.

11. The method of claim 10, wherein the protective layer is an elastic polymer.

12. The method of claim 10, wherein the protective layer is a silicon-based material.

13. The method of claim 1, wherein the semiconductor layer is a semiconductor wafer.

14. The method of claim 1, wherein the semiconductor layer is a semiconductor chip.

15. A method of preparing a chip scale package, comprising:

providing a microelectronic device having a connection surface;

forming a first photoresist layer on the connection surface of the microelectronic device;

forming a plurality of cavities in the first photoresist layer, the plurality of cavities extending though the first photoresist layer to the connection surface; and depositing solder in the plurality of cavities, thereby forming a plurality of solder columns on the connection surface, each solder column having a column thickness of between about 100 and 150 micrometers and, wherein the micro columns of solder have a height between about 100 and 500 micrometers.

16. The method of claim 15, and further comprising:

removing the first photoresist layer.

17. The method of claim 15, and further comprising:

covering the connection surface with a protective layer, the protective layer filling the space between the solder columns.

18. The method of claim 15, and further comprising:

applying a solder bump on an exposed end of each of the solder columns, to provide a means for making an electrical connection with another device.

19. The method of claim 18, wherein the solder bumps are of a different composition and have a different melting temperature than the solder columns.

20. The method of claim 15, and further comprising attaching a substrate to the plurality of solder columns.

21. The method of claim 15, and further comprising attaching a circuit board to the plurality of solder columns.

22. The method of claim 15, wherein the solder is deposited in the plurality of cavities by vapor deposition.

23. The method of claim 15, wherein the solder is deposited in the plurality of cavities by sputtering.

24. The method of claim 15, wherein the solder is deposited in the plurality of cavities by electroplating.

25. The method of claim 15, wherein the solder comprises about 90 percent lead and about 10 percent tin.

26. The method of claim 15, and further comprising:

forming a second photoresist layer on the first photoresist layer;

etching a plurality of cavities in the second photoresist layer, the plurality of cavities extending through the second photoresist layer to the plurality of solder columns; and depositing solder in the plurality of cavities in the second photoresist layer, thereby extending the height of the solder columns.

27. A method of forming a plurality of micro column interconnection structures on a semiconductor wafer, the method comprising:

providing a semiconductor wafer;

forming a first photoresist layer on the semiconductor wafer;

etching a first plurality of cavities in the first photoresist layer, the first plurality of cavities extending through the first photoresist layer to the semiconductor wafer;

depositing solder in the first plurality of cavities using vapor deposition, thereby forming a plurality of micro columns of solder;

forming a second photoresist layer on the first photoresist layer;

etching a second plurality of cavities in the second photoresist layer, the second plurality of cavities extending through the second photoresist layer to the first photoresist layer; and depositing solder in the second plurality of cavities, thereby extending the height of the micro columns of solder.

* * * * *